(12) United States Patent
Hachiya et al.

(10) Patent No.: US 9,872,260 B2
(45) Date of Patent: Jan. 16, 2018

(54) POWER ADJUSTMENT METHOD, COMPUTER-READABLE RECORDING MEDIUM AND POWER ADJUSTMENT APPARATUS

(71) Applicant: FUJITSU LIMITED, Kawasaki-shi, Kanagawa (JP)

(72) Inventors: Nobuhide Hachiya, Sapporo (JP); Takashi Tanii, Sapporo (JP); Yasuhiro Murakami, Sapporo (JP); Yusuke Yamamori, Sapporo (JP); Yasuaki Takeuchi, Sapporo (JP); Masahiko Hirao, Sapporo (JP); Manabu Murakami, Kawasaki (JP); Mikio Hayashihara, Hino (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/168,069

(22) Filed: May 29, 2016

(65) Prior Publication Data

US 2016/0278028 A1 Sep. 22, 2016

Related U.S. Application Data

(63) Continuation of application No. PCT/JP2013/082875, filed on Dec. 6, 2013.

(51) Int. Cl.
*H03G 3/20* (2006.01)
*H04W 52/52* (2009.01)
(Continued)

(52) U.S. Cl.
CPC ............ *H04W 52/52* (2013.01); *H03F 1/32* (2013.01); *H03F 1/3241* (2013.01); *H03F 3/19* (2013.01);
(Continued)

(58) Field of Classification Search
CPC ........ H04W 52/52; H03F 1/32; H03F 1/3241; H03F 3/19; H03F 3/195; H03F 3/213;
(Continued)

(56) References Cited

U.S. PATENT DOCUMENTS 6,400,774 B1   6/2002 Matsuoka et al.
7,333,781 B1 * 2/2008 Stockstad ............. H03F 1/0205
                                                      330/129

(Continued)

FOREIGN PATENT DOCUMENTS

JP     11-177470     7/1999
JP     2001-308724   11/2001

(Continued)

OTHER PUBLICATIONS

International Search Report and Written Opinion of the International Searching Authority (Form PCT/ISA/210, Form PCT/ISA/237), mailed in connection with PCT/JP20131082875 and dated Feb. 25, 2014 (10 pages).

(Continued)

*Primary Examiner* — Khanh V Nguyen
(74) *Attorney, Agent, or Firm* — Fujitsu Patent Center

(57) ABSTRACT

A power adjustment method includes: measuring output power that is obtained when input power to be amplified in a linear region is input to a power amplifier configured to amplify input power linearly in the linear region and amplify input power nonlinearly in a nonlinear region; deriving a straight line connecting a measurement point corresponding to the measured output power and a boundary point between the linear region and the nonlinear region in a coordinate plane representing input/output characteristics; acquiring information on an approximate equation that is stored in advance in correspondence with the measured output power, the approximate equation representing a relation between (Continued)

input power and output power in the nonlinear region; and storing information on the derived straight line and the acquired information on the approximate equation in a semiconductor integrated circuit provided at a preceding stage of the power amplifier.

5 Claims, 7 Drawing Sheets

(51) Int. Cl.
H03F 3/24 (2006.01)
H03F 1/32 (2006.01)
H03G 3/30 (2006.01)
H03F 3/195 (2006.01)
H03F 3/213 (2006.01)
H03F 3/19 (2006.01)

(52) U.S. Cl.
CPC ............ *H03F 3/195* (2013.01); *H03F 3/213* (2013.01); *H03F 3/24* (2013.01); *H03G 3/3042* (2013.01); *H03F 2200/393* (2013.01); *H03F 2200/451* (2013.01); *H03F 2200/465* (2013.01); *H03F 2201/3215* (2013.01)

(58) Field of Classification Search
CPC .......... H03F 3/24; H03G 3/3042; H03G 3/20; H03G 3/3036; H04B 1/04

USPC .................... 330/127, 129, 140, 285, 297
See application file for complete search history.

(56) References Cited

U.S. PATENT DOCUMENTS

| 7,408,403 | B2* | 8/2008 | Farrar | H03F 1/0211 |
| | | | | 330/297 |
| 8,749,307 | B2* | 6/2014 | Zhu | H03F 1/0233 |
| | | | | 330/129 |
| 2002/0097811 | A1 | 7/2002 | Kubo et al. | |
| 2003/0076896 | A1 | 4/2003 | Ball et al. | |
| 2009/0023402 | A1 | 1/2009 | Shimizu et al. | |
| 2009/0045989 | A1 | 2/2009 | Esumi et al. | |
| 2011/0304390 | A1 | 12/2011 | Huang | |

FOREIGN PATENT DOCUMENTS

| JP | 2003-520478 | 7/2003 |
| JP | 2006-333445 | 12/2006 |
| JP | 2007-200378 | 8/2007 |
| JP | 2009-284313 | 12/2009 |
| WO | 01/52405 | 7/2001 |

OTHER PUBLICATIONS

EESR—The Extended European Search Report dated Oct. 28, 2016, issued for European Patent Application No. 13898510.6.

* cited by examiner

| GROUP | CO-EFFICIENT A | CO-EFFICIENT B | CO-EFFICIENT C | CO-EFFICIENT D | COMPRESSION START POINT | |
|---|---|---|---|---|---|---|
| | | | | | INPUT POWER | OUTPUT POWER |
| GAIN "LARGE" | A1 | B1 | C1 | D1 | $P_{c\_in1}$ | $P_{c\_out1}$ |
| GAIN "MEDIUM" | A2 | B2 | C2 | D2 | $P_{c\_in2}$ | $P_{c\_out2}$ |
| GAIN "SMALL" | A3 | B3 | C3 | D3 | $P_{c\_in3}$ | $P_{c\_out3}$ |

| FRE-QUEN-CY | LINEAR REGION | | NONLINEAR REGION | | | | COMPRESSION START POINT | |
|---|---|---|---|---|---|---|---|---|
| | CO-EFFICIENT a | CO-EFFICIENT b | CO-EFFICIENT A | CO-EFFICIENT B | CO-EFFICIENT C | CO-EFFICIENT D | INPUT POWER | OUTPUT POWER |
| f1 | a1 | b1 | A1 | B1 | C1 | D1 | $P_{c\_in1}$ | $P_{c\_out1}$ |
| f2 | a2 | b2 | A2 | B2 | C2 | D2 | $P_{c\_in2}$ | $P_{c\_out2}$ |
| ⋮ | | | | | | | | |

POWER ADJUSTMENT METHOD, COMPUTER-READABLE RECORDING MEDIUM AND POWER ADJUSTMENT APPARATUS

CROSS-REFERENCE TO RELATED APPLICATION

This application is a continuation of International Application No. PCT/JP2013/082875, filed on Dec. 6, 2013 and designating the U.S., the entire contents of which are incorporated herein by reference.

FIELD

The present invention relates to a power adjustment method, a power adjustment program and a power adjustment apparatus.

BACKGROUND

In general, wireless communication apparatuses such as mobile phones are equipped with a power amplifier for transmission power control and other purposes. When a wireless communication apparatus executes transmission power control, output power from a power amplifier is specified. The wireless communication apparatus adjusts input power to the power amplifier so that the output power has a specified value. As a result, transmission power from the wireless communication apparatus converges to a desired value, thereby reducing interference with other wireless communication apparatuses and improving reception quality at a communications partner.

A power amplifier is a component that amplifies and outputs power of input signals. For example, a power amplifier has input/output characteristics as illustrated in FIG. 1. Specifically, input power and output power have linearity until the output power reaches predetermined power Pc, and when the output power exceeds the predetermined power Pc, the relation between input power and output power becomes nonlinear. In the following, the region in which the input/output characteristics have linearity (in FIG. 1, the region in which the output power is less than the power Pc) is referred to as "linear region", and the region in which the input/output characteristics are nonlinear (in FIG. 1, the region in which the output power is equal to or more than the power Pc) is referred to as "nonlinear region".

Such input/output characteristics of power amplifiers generally vary depending on individuals, and it is difficult to completely match linear regions and nonlinear regions among individual power amplifiers. Accordingly, before wireless communication apparatuses are shipped to market, the wireless communication apparatuses are adjusted to compensate for individual difference in input/output characteristics of power amplifiers. Specifically, input/output characteristics of respective power amplifiers included in wireless communication apparatuses are actually measured, and actual measurement results are stored in memories of the wireless communication apparatuses or other storage devices. Then, when the wireless communication apparatus is used after shipment, transmission power control is executed based on the actual measurement results of input/output characteristics stored in the memory or other storage devices.

Patent Literature 1: Japanese National Publication of International Patent Application No. 2003-520478

Patent Literature 2: Japanese Laid-open Patent Publication No. 2009-284313

Patent Literature 3: Japanese Laid-open Patent Publication No. 2007-200378

Patent Literature 4: Japanese Laid-open Patent Publication No. 2001-308724

However, the method of adjusting power of power amplifiers based on actual measurements has a problem in that it takes a longer time to adjust wireless communication apparatuses before shipment and accordingly manufacturing cost increases. Specifically, the actual measurements of input/output characteristics of power amplifiers involve measuring output power at a plurality of measurement points with different input powers. In this case, in order to obtain precise input/output characteristics, it is preferred to increase the number of measurement points so as to acquire a larger number of correspondence relations between input power and output power. Therefore, the time for measuring output power for individual wireless communication apparatuses is increased, and it takes a long time to adjust power before shipment. In particular, in recent years, a single wireless communication apparatus is capable of communications in a plurality of frequency bands, and input/output characteristics of a power amplifier differ from one frequency band to another. It is therefore considered that the acquisition of input/output characteristics for each frequency band further increases the time for power adjustment.

Furthermore, in order for a wireless communication apparatus to execute transmission power control, a correspondence relation between input power and output power representing actually measured input/output characteristics is stored in a memory of the wireless communication apparatus or other storage devices. In this case, if a larger number of correspondence relations are stored, a larger storage area such as a memory is occupied, and hence a memory having large storage capacity is mounted in the wireless communication apparatus. As a result, there is another problem in that manufacturing cost of the wireless communication apparatuses further increases. As described above, the method of adjusting power of power amplifiers by measuring power at a plurality of measurement points is inefficient, and the manufacturing cost of the wireless communication apparatuses increases. It is thus desired to efficiently adjust power.

SUMMARY

According to an aspect of an embodiment, a power adjustment method includes: measuring output power that is obtained when input power to be amplified in a linear region is input to a power amplifier configured to amplify input power linearly in the linear region in which output power is less than a predetermined value and amplify input power nonlinearly in a nonlinear region in which output power is equal to or more than the predetermined value; deriving, using a processor, a straight line connecting a measurement point corresponding to the measured output power and a boundary point between the linear region and the nonlinear region in a coordinate plane representing input/output characteristics; acquiring, using the processor, information on an approximate equation that is stored in advance in correspondence with the measured output power, the approximate equation representing a relation between input power and output power in the nonlinear region; and storing information on the derived straight line and the acquired information on the approximate equation in a semiconductor integrated circuit provided at a preceding stage of the power amplifier.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENTS

Preferred embodiments of a power adjustment method, a power adjustment program and a power adjustment apparatus disclosed in the present invention will be described in detail below with reference to the accompanying drawings. The present invention is not limited to the embodiments described below.

Figure 1:
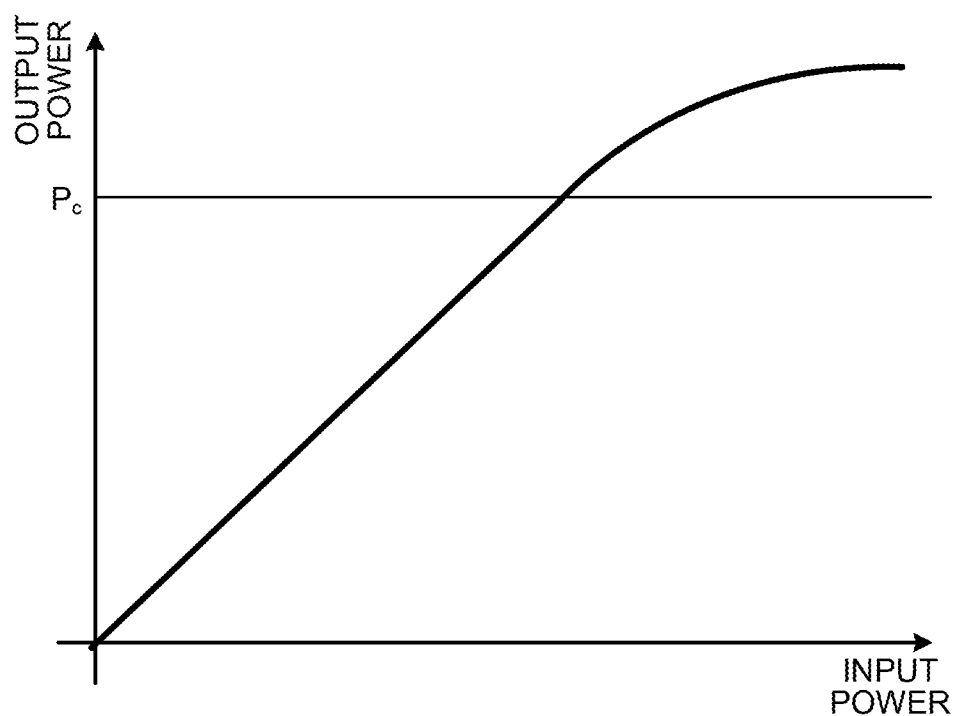
FIG. 1 is a diagram illustrating an example of input/output characteristics of a power amplifier.
Figure 2:
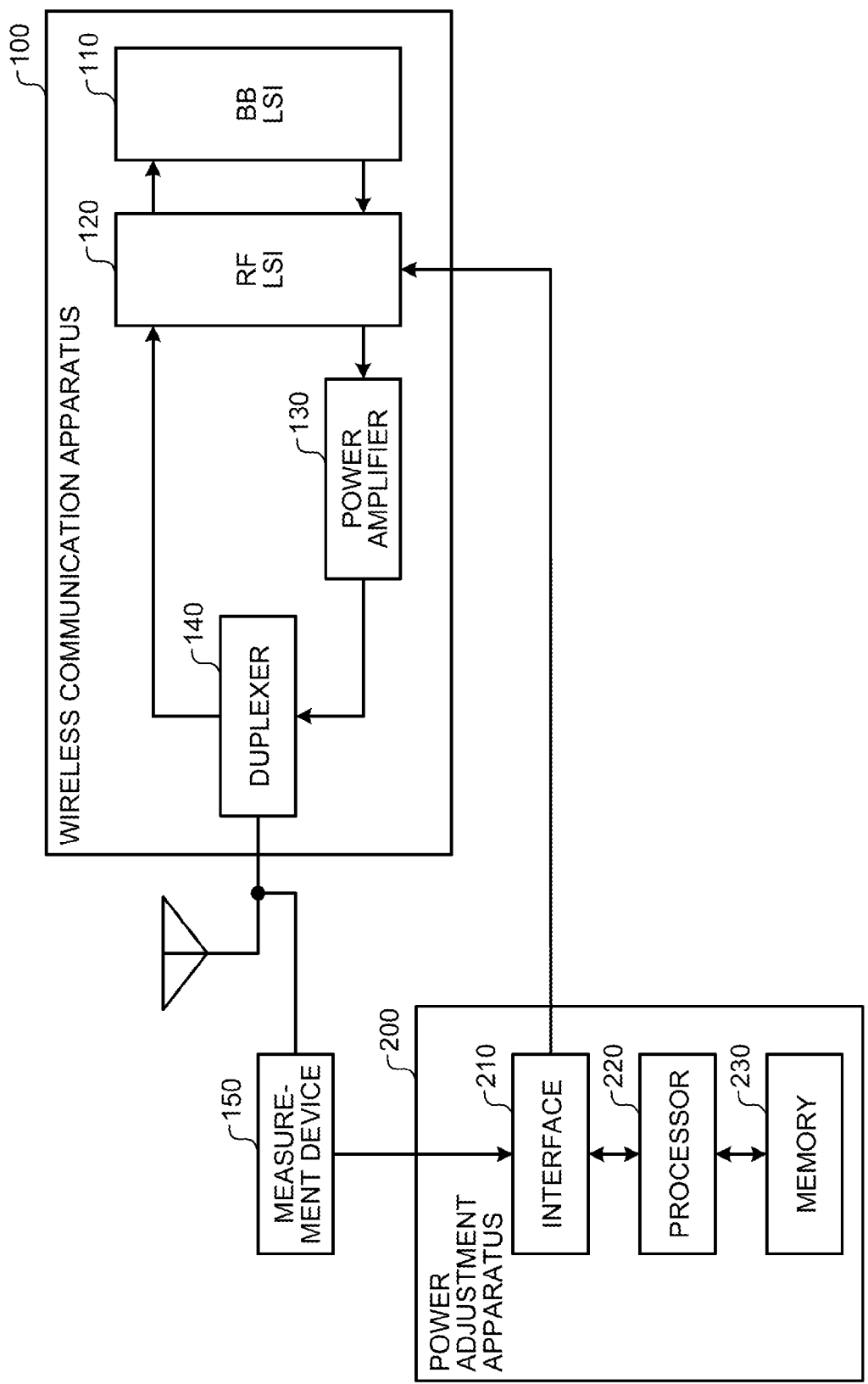
FIG. 2 is a block diagram illustrating a configuration of a power adjustment system according to one embodiment.

FIG. 2 is a block diagram illustrating a configuration of a power adjustment system according to one embodiment. The power adjustment system illustrated in FIG. 2 includes a wireless communication apparatus 100, a measurement device 150, and a power adjustment apparatus 200. Such a power adjustment system is configured when the respective apparatus are connected to one another before the wireless communication apparatus 100 is shipped to market.

The wireless communication apparatus 100 is a wireless communication apparatus such as a mobile phone, and transmits and receives signals via an antenna. The wireless communication apparatus 100 includes a baseband large scale integration (LSI) (hereinafter abbreviated as "BB LSI") 110, a radio frequency LSI (hereinafter abbreviated as "RF LSI") 120, a power amplifier 130, and a duplexer 140.

The BB LSI 110 is a semiconductor integrated circuit configured to execute processing on baseband frequency signals. Specifically, the BB LSI 110 subjects transmission data to processing such as coding and modulation, and outputs the resultant to the RF LSI 120. Furthermore, the BB LSI 110 subjects reception data output from the RF LSI 120 to processing such as demodulation and decoding.

The RF LSI 120 is a semiconductor integrated circuit that is disposed at the preceding stage of the power amplifier 130 and configured to execute processing on radio frequency signals. Specifically, the RF LSI 120 subjects transmission data output from the BB LSI 110 to wireless transmission processing such as upconversion and filtering. Then, the RF LSI 120 adjusts power of the transmission data so that transmission power from the wireless communication apparatus 100 becomes specified power, and outputs the resultant to the power amplifier 130. Furthermore, the RF LSI 120 subjects reception data to wireless reception processing such as downconversion and filtering, and outputs the resultant to the BB LSI 110. Note that a specific internal configuration of the RF LSI 120 is described later in detail.

The power amplifier 130 amplifies and outputs transmission data output from the RF LSI 120. Specifically, the power amplifier 130 receives power of transmission data output from the RF LSI 120 as input power, amplifies the input power with a predetermined gain, and outputs transmission data of the obtained output power. The power amplifier 130 has input/output characteristics that the relation between input power and output power is linear until the output power reaches a predetermined value and the relation between input power and output power is nonlinear when the output power exceeds the predetermined value.

The duplexer 140 is connected to the antenna. The duplexer 140 transmits from the antenna the transmission data output from the power amplifier 130, and outputs reception data received from the antenna to the RF LSI 120. Furthermore, the duplexer 140 electrically isolates a reception path of signals received by the antenna and a transmission path of signals transmitted by the antenna.

The measurement device 150 is connected to an antenna part of the wireless communication apparatus 100. The measurement device 150 measures power of transmission data output from the duplexer 140 of the wireless communication apparatus 100. Specifically, the measurement device 150 measures output power obtained by being amplified by the power amplifier 130.

Then, the power adjustment apparatus 200 is connected to the measurement device 150. The power adjustment apparatus 200 is an information processing apparatus such as a personal computer, and includes an interface 210, a processor 220, and a memory 230.

The interface 210 is connected to the RF LSI 120 of the wireless communication apparatus 100 and is also connected to the measurement device 150. Then, the interface 210 outputs, to the RF LSI 120, an instruction of input power to be input to the power amplifier 130. Furthermore, the interface 210 acquires output power of the power amplifier 130 measured by the measurement device 150. In addition, the interface 210 outputs a power adjustment coefficient determined by the processor 220 to the RF LSI 120.

The processor 220 instructs the RF LSI 120 via the interface 210 about input power to be input to the power amplifier 130. Then, the processor 220 acquires output power that is obtained as a result of amplifying the instructed input power by the power amplifier 130, via the measurement device 150 and the interface 210. In this case, the processor 220 instructs the RF LSI 120 about only single input power, and acquires output power corresponding to the input power. Specifically, the processor 220 does not acquire output power at a plurality of measurement points, but acquires output power at a single measurement point. Then, the processor 220 determines a power adjustment coefficient suitable for the power amplifier 130 based on a pair of input power and output power, and sets the determined coefficient to the RF LSI 120 via the interface 210. Note that specific functions of the processor 220 are described later in detail.

The memory 230 stores therein in advance input/output characteristics information of power amplifiers of the same type as the power amplifier 130, which are obtained from test models of wireless communication apparatus of the same type as the wireless communication apparatus 100.

Specifically, the memory 230 stores therein in advance, as input/output characteristics information of a plurality of power amplifiers, information on an approximate equation representing the relation between input power and output power in a nonlinear region and information on a point corresponding to a boundary between a linear region and the nonlinear region (hereinafter referred to as "compression start point"). In this case, the memory 230 stores therein the approximate equation information and the compression start point information for each group grouped based on the gain of the power amplifier.

Figures 3, 4:
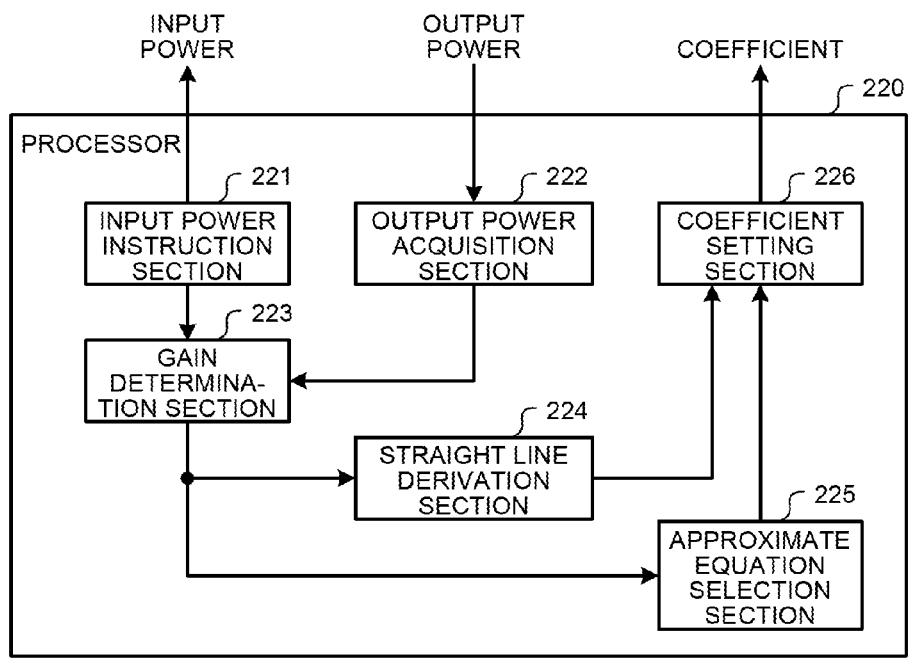
FIG. 3 is a diagram illustrating a specific example of input/output characteristics information according to one embodiment.
FIG. 4 is a block diagram illustrating functions of a processor according to one embodiment.

Specifically, the memory 230 groups the gain of the power amplifier into three classes of "large", "medium", and "small" as illustrated in FIG. 3, for example. The memory 230 stores therein coefficients of the approximate equation for each group, and also stores therein input power and output power at the compression start point. The example of FIG. 3 represents the case where input/output characteristics of the power amplifier in the nonlinear region are approximated by a cubic equation. Four coefficients (coefficient A, coefficient B, coefficient C, and coefficient D) of the cubic equation are stored for each group of the gain. Furthermore, input power and output power at the boundary between the linear region and the nonlinear region in the input/output characteristics for each group of the gain are stored. The input/output characteristics information as illustrated in FIG. 3 is obtained when test models of wireless communication apparatus are grouped based on the gain and output power of a power amplifier belonging to each group is measured while input power of the power amplifier is changed.

FIG. 4 is a block diagram illustrating functions of the processor 220 of the power adjustment apparatus 200 according to this embodiment. The processor 220 illustrated in FIG. 4 includes an input power instruction section 221, an output power acquisition section 222, a gain determination section 223, a straight line derivation section 224, an approximate equation selection section 225, and a coefficient setting section 226.

In the state in which the power adjustment apparatus 200 is connected to the wireless communication apparatus 100 and the measurement device 150 as illustrated in FIG. 2, the input power instruction section 221 instructs the RF LSI 120 of the wireless communication apparatus 100 about only one input power to the power amplifier 130 for each frequency band. Specifically, the input power instruction section 221 instructs the RF LSI 120 about single power that can be amplified by the power amplifier 130 in the linear region as input power for each frequency band. Here, the power that can be amplified in the linear region is power that is determined based on performance of the power amplifier 130, such as the dynamic range, and is relatively small power of less than a predetermined value. Note that minute power close to zero is power that can be amplified in the linear region, but if the input power is excessively small, the operation of the power amplifier 130 may be unstable. It is therefore preferred that the input power instruction section 221 instruct the RF LSI 120 about power of a predetermined value or more as input power.

The output power acquisition section 222 acquires a measurement result of output power that is obtained when the input power instructed by the input power instruction section 221 is amplified by the power amplifier 130, from the measurement device 150 via the interface 210. Because the input power instruction section 221 instructs the RF LSI 120 about single input power for each frequency band, the output power acquisition section 222 acquires output power at one measurement point for each frequency band. Consequently, the time needed for the instruction of input power by the input power instruction section 221 and the acquisition of output power by the output power acquisition section 222 can be reduced.

The gain determination section 223 determines which of the groups "large", "medium", and "small" the gain of the power amplifier 130 belongs to based on the input power instructed by the input power instruction section 221 and the output power acquired by the output power acquisition section 222. Specifically, the gain determination section 223 compares output power of an average power amplifier (hereinafter referred to as "average power") corresponding to the input power instructed by the input power instruction section 221 with the output power acquired by the output power acquisition section 222. Then, when the output power is larger than the average power by a predetermined value or more, the gain determination section 223 determines that the gain of the power amplifier 130 is "large". Furthermore, when the difference between the output power and the average power is within a predetermined value, the gain determination section 223 determines that the gain of the power amplifier 130 is "medium". In addition, when the output power is smaller than the average power by a predetermined value or more, the gain determination section 223 determines that the gain of the power amplifier 130 is "small". The gain determination section 223 notifies the straight line derivation section 224 and the approximate equation selection section 225 of the determination result of the gain of the power amplifier 130.

When notified of the determination result of the gain from the gain determination section 223, the straight line derivation section 224 reads a compression start point corresponding to the notified determination result from the memory 230. Specifically, for example, when notified that the gain of the power amplifier 130 is "large", the straight line derivation section 224 reads input power Pc-in1 and output power Pc-out1 from the input/output characteristics information illustrated in FIG. 3. Then, the straight line derivation section 224 derives a straight line in the linear region of the input/output characteristics of the power amplifier 130 based on input power and output power at the read compression start point and input power and output power obtained by actual measurement. Specifically, the straight line derivation section 224 derives a straight line connecting the compression start point stored in advance for each group of the gain and a measurement point of the actually measured output power. Then, the straight line derivation section 224 notifies the coefficient setting section 226 of coefficients of the derived straight line, such as the slope and the intercept.

When notified of the determination result of the gain from the gain determination section 223, the approximate equation selection section 225 reads coefficients of the approximate equation corresponding to the notified determination result from the memory 230. Specifically, for example, when notified that the gain of the power amplifier 130 is "large", the approximate equation selection section 225 reads A1, B1, C1, and D1 as the coefficients A, B, C, and D, respectively, from the input/output characteristics information illustrated in FIG. 3. Then, the approximate equation selection section 225 notifies the coefficient setting section 226 of the read coefficients.

Note that the above-mentioned processing performed by the gain determination section 223, the straight line derivation section 224, and the approximate equation selection section 225 is executed for each frequency band of the signal input to the power amplifier 130. Accordingly, when the coefficient setting section 226 is notified of coefficients, the coefficient setting section 226 is notified of a set of coefficients for each frequency band.

The coefficient setting section 226 sets the coefficients notified from the straight line derivation section 224 and the coefficients notified from the approximate equation selection section 225 to the RF LSI 120 of the wireless communication apparatus 100 via the interface 210. Specifically, the coefficient setting section 226 causes the RF LSI 120 to store therein a set of coefficients for each frequency band. Furthermore, the coefficient setting section 226 causes the RF LSI 120 to store therein input power and output power at the compression start point used to derive the straight line by the straight line derivation section 224. The coefficients set to the RF LSI 120 by the coefficient setting section 226 are used to appropriately adjusting input power to the power amplifier 130 after the wireless communication apparatus 100 is shipped to market.

The RF LSI 120 stores therein a set of coefficients and input power and output power at the compression start point for each frequency band, and these pieces of information are information on arithmetic expressions representing the input/output characteristics of the power amplifier 130. Then, a storage area for storing therein the information on arithmetic expressions can be reduced to be smaller than when correspondence relations between input power and output power at a large number of measurement points are stored. Consequently, an increase in manufacturing costs of the wireless communication apparatus 100 having the RF LSI 120 installed therein can be suppressed.

Figures 5, 6:
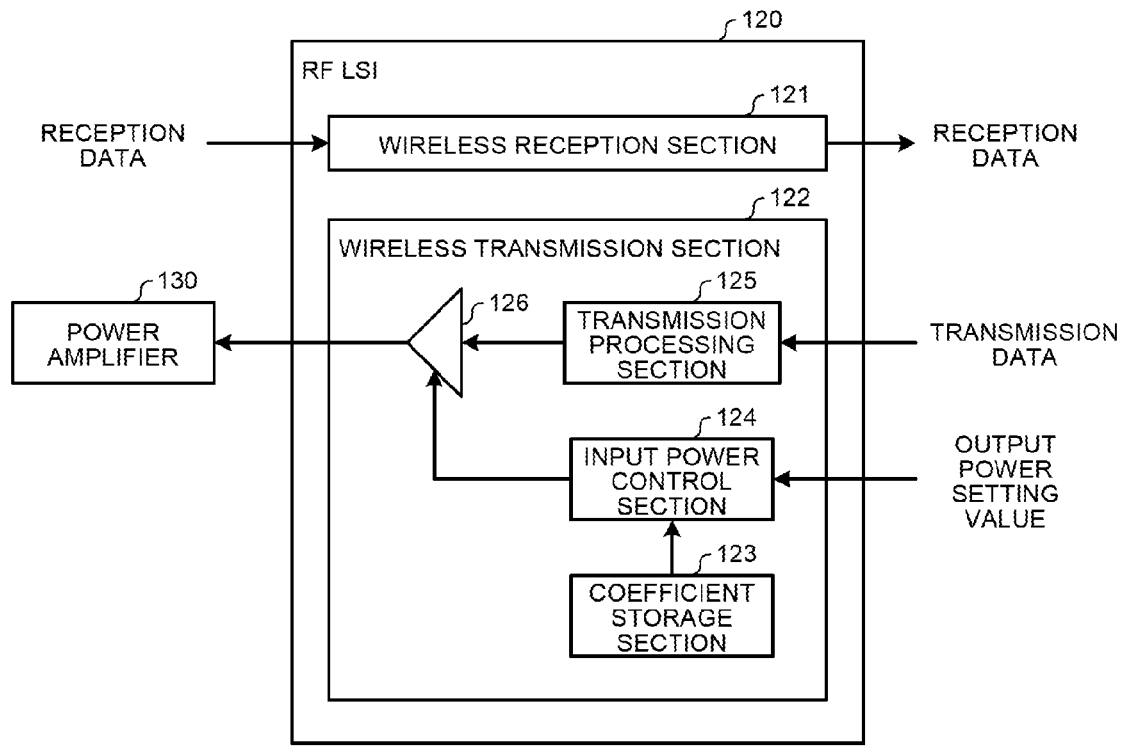
FIG. 5 is a block diagram illustrating an internal configuration of an RF LSI according to one embodiment.
FIG. 6 is a diagram illustrating a specific example of setting information according to one embodiment.

FIG. 5 is a block diagram illustrating an internal configuration of the RF LSI 120 of the wireless communication apparatus 100 according to this embodiment. Note that FIG. 5 illustrates the configuration of the RF LSI 120 related to transmission power control after the wireless communication apparatus 100 is shipped to market. The RF LSI 120 illustrated in FIG. 5 includes a wireless reception section 121 and a wireless transmission section 122.

The wireless reception section 121 subjects reception data received via the antenna to predetermined wireless reception processing such as downconversion and filtering, and outputs the reception data to the BB LSI 110.

The wireless transmission section 122 adjusts power of transmission data output from the BB LSI 110, and outputs the resultant to the power amplifier 130. Specifically, the wireless transmission section 122 includes a coefficient storage section 123, an input power control section 124, a transmission processing section 125, and an amplifier 126.

The coefficient storage section 123 stores therein coefficients set by the power adjustment apparatus 200 before the wireless communication apparatus 100 is shipped to market. Specifically, the coefficient storage section 123 stores therein setting information for each frequency band as illustrated in FIG. 6, for example. The setting information is information on arithmetic expressions representing the input/output characteristics of the power amplifier 130, and includes coefficients representing the straight-line equation in the linear region, coefficients representing the approximate equation in the nonlinear region, and information on the compression start point.

In the example illustrated in FIG. 6, it is understood that, for example, when the power amplifier 130 amplifies a signal of the frequency band f1, the coefficients a and b representing the linear region are a1 and b1, respectively, and the coefficients A, B, C, and D representing the nonlinear region are A1, B1, C1, and D1, respectively. Furthermore, it is understood that when the power amplifier 130 amplifies the signal of the frequency band f1, input power and output power at the compression start point are Pc-in1 and Pc-out1, respectively. These pieces of setting information stored in the coefficient storage section 123 are set in consideration of the individual difference in input/output characteristics among the power amplifier 130 and other power amplifiers, and hence transmission power control by the wireless communication apparatus 100 is high in precision.

When a setting value for specifying output power of the power amplifier 130 is input to the input power control section 124 from the BB LSI 110, the input power control section 124 reads coefficients for determining input power corresponding to the setting value from the coefficient storage section 123, and determines input power to the power amplifier 130. Then, the input power control section 124 adjusts the gain of the amplifier 126 so that power of transmission data is amplified to the determined input power.

The transmission processing section 125 subjects transmission data input from the BB LSI 110 to predetermined wireless transmission processing such as upconversion and filtering, and outputs the transmission data to the amplifier 126.

The amplifier 126 amplifies the transmission data with the gain adjusted by the input power control section 124. As a result, the amplifier 126 sets the input power to the power amplifier 130 to be power that enables output power from the power amplifier 130 to match with the setting value. Consequently, the wireless communication apparatus 100 can adjust transmission power to predetermined power, thereby executing accurate transmission power control.

Figure 7:
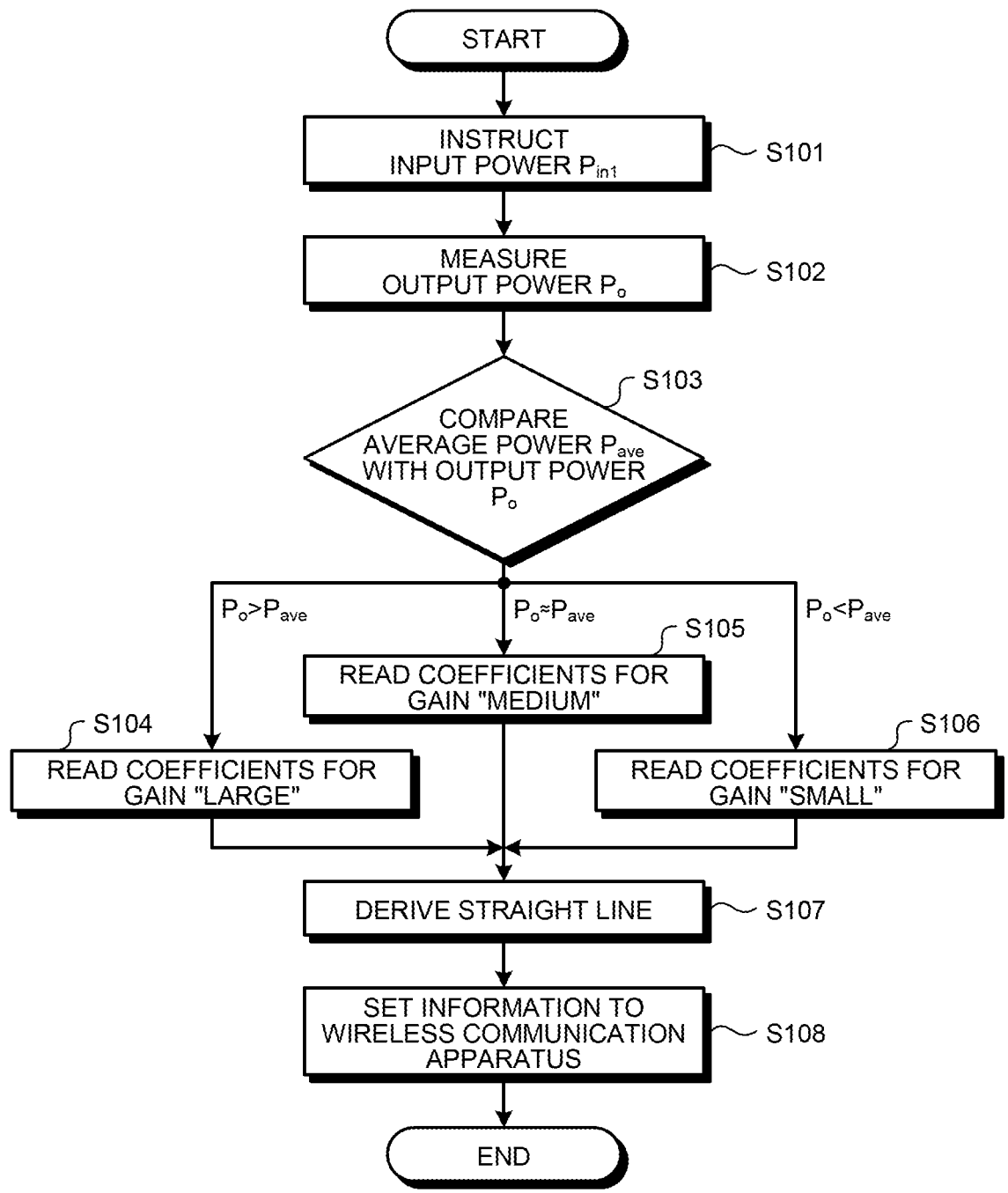
FIG. 7 is a flowchart illustrating an operation of a power adjustment apparatus according to one embodiment.

Next, the power adjustment operation in the power adjustment system configured as described above is described with reference to the flowchart illustrated in FIG. 7. FIG. 7 is a flowchart illustrating the operation of the power adjustment apparatus 200 according to this embodiment.

Before the wireless communication apparatus 100 is shipped to market, the wireless communication apparatus 100 is connected to the power adjustment apparatus 200 and the measurement device 150 to adjust power of the power amplifier 130. Specifically, the processor 220 of the power adjustment apparatus 200 sets the coefficients corresponding to the input/output characteristics of the power amplifier 130 to the RF LSI 120 of the wireless communication apparatus 100.

Specifically, the input power instruction section 221 of the processor 220 instructs the RF LSI 120 about single input power Pin1 (Step S101). The input power Pin1 is power that can be amplified in the linear region in input/output characteristics of the power amplifier 130 and power amplifiers of the same type of the power amplifier 130. Then, the RF LSI 120 inputs the instructed input power to the power amplifier 130, and the input power is amplified by the power amplifier 130. Output power Po obtained by the amplification is measured by the measurement device 150, and the measurement result is acquired by the output power acquisition section 222 of the processor 220 (Step S102).

Then, the gain determination section 223 compares the average power Pave stored in advance correspondingly to the input power Pin1 with the output power Po (Step S103). The average power Pave is output power of an average power amplifier corresponding to the input power Pin1, and hence the magnitude of the gain of the power amplifier 130 can be determined based on the comparison by the gain determination section 223. Specifically, when the output power Po is larger than the average power Pave, it means that the gain of the power amplifier 130 is larger than that of the average power amplifier, and when the output power Po is smaller than the average power Pave, it means that the gain of the power amplifier 130 is smaller than that of the average power amplifier.

In view of the above, the gain determination section 223 determines whether the gain of the power amplifier 130 is "large", "medium", or "small" based on the magnitude relation between the output power Po and the average power Pave. Specifically, when the output power Po is larger than the average power Pave by a predetermined value or more, the gain of the power amplifier 130 is determined to be "large". Furthermore, when the difference between the output power Po and the average power Pave is within a predetermined value, the gain of the power amplifier 130 is determined to be "medium". In addition, when the output power Po is smaller than the average power Pave by a predetermined value or more, the gain of the power amplifier 130 is determined to be "small".

The determination result by the gain determination section 223 is notified to the straight line derivation section 224 and the approximate equation selection section 225. Then, the approximate equation selection section 225 reads coefficients in the nonlinear region corresponding to the determination result of the gain from the memory 230. Specifically, when the gain of the power amplifier 130 is "large", the coefficients of the approximate equation corresponding to the gain "large" are read by the approximate equation selection section 225 (Step S104). Furthermore, when the gain of the power amplifier 130 is "medium", the coefficients of the approximate equation corresponding to the gain "medium" are read by the approximate equation selection section 225 (Step S105). Similarly, when the gain of the power amplifier 130 is "small", the coefficients of the approximate equation corresponding to the gain "small" are read by the approximate equation selection section 225 (Step S106).

As described above, in this embodiment, the gain of the power amplifier 130 is determined based on output power that is actually measured in the state in which the wireless communication apparatus 100 is connected to the power adjustment apparatus 200, and the approximate equation in the nonlinear region corresponding to the gain is selected. Consequently, the power adjustment apparatus 200 can obtain input/output characteristics in the nonlinear region that reflect the individual difference among power amplifiers. In this case, the actually measured output power is only output power at one measurement point, and hence it does not take a long time for the measurement, thus enabling the input/output characteristics to be efficiently obtained.

The coefficients read by the approximate equation selection section 225 are notified to the coefficient setting section 226. The straight line derivation section 224 reads the compression start point corresponding to the determination result of the gain from the memory 230. Specifically, the straight line derivation section 224 reads input power and output power at the compression start point, which are stored in advance in correspondence with the gain. Then, a straight line in the linear region of the power amplifier 130 is derived based on the input power and the output power at the compression start point and the input power Pin1 and the output power Po at the time of measurement (Step S107). Specifically, a straight-line equation connecting the compression start point and the measurement point for the output power.

As described above, in this embodiment, the gain of the power amplifier 130 is determined based on the output power that is actually measured in the state in which the wireless communication apparatus 100 is connected to the power adjustment apparatus 200, and the straight line is derived based on the compression start point corresponding to the gain and the actual measurement result. Consequently, the power adjustment apparatus 200 can obtain input/output characteristics in the linear region that reflect the individual difference among power amplifiers. In this case, the actually measured output power is only output power at one measurement point, and hence it does not take a long time for the measurement, thus enabling the input/output characteristics to be efficiently obtained.

The coefficients of the straight-line equation derived by the straight line derivation section 224 are notified to the coefficient setting section 226. Then, the coefficient setting section 226 outputs the coefficients of the straight-line equation in the linear region and the coefficients of the approximate equation in the nonlinear region together with the input power and the output power at the compression start point to the RF LSI 120, and stores these pieces of information in the coefficient storage section 123 (Step S108). Note that the above-mentioned processing of Steps S101 to S107 is executed for each frequency band whose signal can be transmitted by the wireless communication apparatus 100. For this reason, the coefficient setting section 226 causes the coefficient storage section 123 to store therein the coefficients and the compression start point for each frequency band.

Consequently, when output power corresponding to single input power for one frequency band is measured, coefficients that reflect the natural characteristics of the power amplifier 130 can be stored in the wireless communication apparatus 100. In other words, the coefficients that take the individual difference among power amplifiers into consideration can be set in a short period of time, and the apparatus manufacturing costs can be reduced.

Next, a specific example of power adjustment by the power adjustment apparatus 200 is described with reference to FIG. 8.

Figure 8:
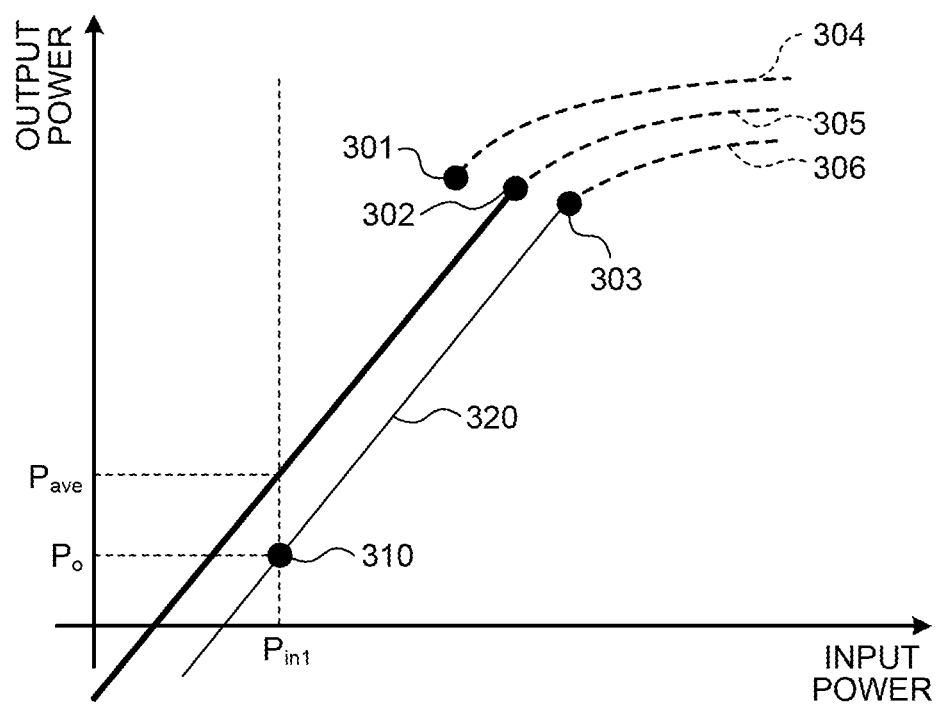
FIG. 8 is a diagram illustrating a specific example of power adjustment according to one embodiment.

The memory 230 of the power adjustment apparatus 200 stores therein compression start points 301, 302, and 303 and the coefficients corresponding to approximate curves 304, 305, and 306 in the nonlinear region illustrated in FIG. 8. The compression start point 301 and the approximate curve 304 correspond to the power amplifier whose gain is "large", the compression start point 302 and the approximate curve 305 correspond to the power amplifier whose gain is "medium", and the compression start point 303 and the approximate curve 306 correspond to the power amplifier whose gain is "small". Such input/output characteristics information is acquired by actual measurement on test models of wireless communication apparatus, and is stored in the memory 230 of the power adjustment apparatus 200 in advance.

It is now assumed that input power Pin1 is instructed by the input power instruction section 221 and output power Po is obtained by the output power acquisition section 222. It is further assumed that output power of an average power amplifier (average power) corresponding to the input power Pin1 is Pave. When the output power Po is obtained, the gain determination section 223 compares the output power Po with the average power Pave to determine the gain of the power amplifier 130. In this case, the output power Po is smaller than the average power Pave, and hence the gain of the power amplifier 130 is determined to be "small".

Accordingly, the approximate equation selection section 225 reads the coefficients of the approximate curve 306 corresponding to the power amplifier whose gain is "small" from the memory 230, and notifies the coefficient setting section 226 of the read coefficients. The straight line derivation section 224 derives a straight line 320 connecting the compression start point 303 and a measurement point 310, and notifies the coefficient setting section 226 of the coefficients of the straight line 320. When input power and output power at the compression start point 303 are represented by Pc-in and Pc-out, respectively, the slope a of the straight line 320 can be calculated by Expression (1).

$$a=(Po-Pc\text{-out})/(Pin1-Pc\text{-in}) \quad (1)$$

The intercept b of the straight line 320 can be calculated by Expression (2) using the slope a.

$$b=Po-a\cdot Pin1 \quad (2)$$

The coefficients of the straight line 320, which are notified to the coefficient setting section 226, include the slope a and the intercept b. Then, the coefficients of the approximate curve 306 and the coefficients of the straight line 320 are notified to the coefficient setting section 226, and hence the coefficient setting section 226 can cause the RF LSI 120 to store therein the input/output characteristics of the power amplifier 130, which are formed by the straight line 320 and the approximate curve 306 illustrated in FIG. 8.

The input/output characteristics are obtained as a result of determining the approximate curve and the straight line based on the measurement point 310, and therefore reflect the natural characteristics of the power amplifier 130. The input/output characteristics can be determined by simply measuring the output power Po at the measurement point 310. Consequently, the time needed for power adjustment can be reduced to efficiently adjust power of the power amplifier.

Figure 9:
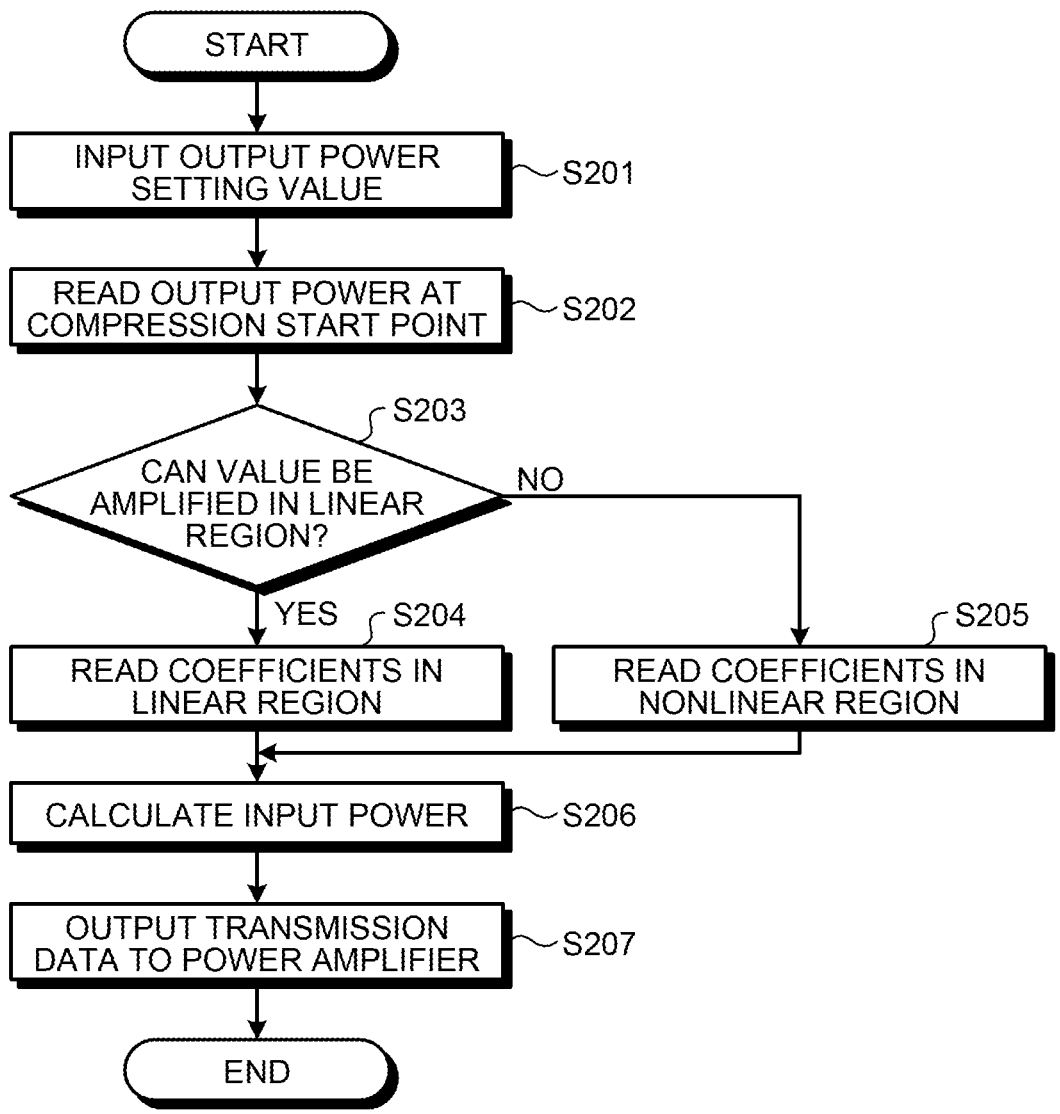
FIG. 9 is a flowchart illustrating an operation of the RF LSI according to one embodiment.

Next, transmission power control by the wireless communication apparatus 100 whose power is adjusted as described above is described with reference to the flowchart illustrated in FIG. 9. FIG. 9 is a flowchart illustrating the operation of the RF LSI 120 of the wireless communication apparatus 100.

When the wireless communication apparatus 100 performs transmission power control, a setting value of output power of the power amplifier 130 corresponding to desired transmission power is input from the BB LSI 110 to the RF LSI 120 (Step S201). The output power setting value is input to the input power control section 124 in the RF LSI 120. Transmission data transmitted from the wireless communication apparatus 100 is input from the BB LSI 110 to the transmission processing section 125 in the RF LSI 120. The transmission data is subjected to wireless transmission processing such as upconversion and filtering by the transmission processing section 125, and is output to the amplifier 126. Then, power of the transmission data is amplified by the amplifier 126 to power that is determined as follows.

Specifically, the input power control section 124 reads output power at the compression start point stored in the coefficient storage section 123 (Step S202), and is compared with the output power setting value. Then, the input power control section 124 determines whether the output power setting value is output power that can be amplified in the linear region (Step S203). Specifically, when the output power setting value is less than the output power at the compression start point, the output power setting value is determined to be output power that can be amplified in the linear region, and when the output power setting value is equal to or more than the output power at the compression start point, the output power setting value is determined to be output power that can be amplified in the nonlinear region.

Then, when the output power setting value is determined to be output power that can be amplified in the linear region (Yes at Step S203), the input power control section 124 reads coefficients representing a straight-line equation in the linear region from the coefficient storage section 123 (Step S204). Specifically, the input power control section 124 reads the coefficients representing the straight line in the linear region of the power amplifier 130, such as the slope and the intercept.

By contrast, when the output power setting value is determined to be output power that can be amplified in the nonlinear region (No at Step S203), the input power control section 124 reads coefficients representing an approximate equation in the nonlinear region from the coefficient storage section 123 (Step S205).

When the coefficients are read by the input power control section 124, the coefficients are used to calculate input power corresponding to the output power setting value (Step S206). Specifically, input power to the power amplifier 130 that matches the output power of the power amplifier 130 with the setting value is calculated by the input power control section 124. Then, the gain of the amplifier 126 is set by the input power control section 124 so that the calculated input power is obtained.

As a result of setting the gain of the amplifier 126, power of transmission data is amplified, and the transmission data is output to the power amplifier 130 (Step S207). When the transmission data is amplified by the power amplifier 130, the resultant output power matches with the output power setting value. Specifically, the coefficient storage section 123 stores therein the coefficients that reflect the natural characteristics of the power amplifier 130, and the input power to the power amplifier 130 is adjusted based on the coefficients, and hence precise transmission power control is executed.

As described above, according to this embodiment, input/output characteristics of the power amplifier included in the wireless communication apparatus are determined based on actual measurements of output power corresponding to single input power, and coefficients of the determined input/output characteristics are stored in the RF LSI disposed at the preceding stage of the power amplifier. Consequently, the time needed for determination of the input/output characteristics of the power amplifier can be reduced to efficiently adjust power of the power amplifier and reduce the apparatus manufacturing cost. Furthermore, according to this embodiment, when the wireless communication apparatus controls transmission power, the RF LSI calculates input power to the power amplifier based on the stored coefficients. Consequently, the input power that reflects the natural characteristics of the power amplifier can be calculated to execute accurate transmission power control.

Note that, in the above-mentioned embodiment, the gain of the power amplifier 130 is grouped into three classes, and the power adjustment apparatus 200 stores therein in advance a compression start point and an approximate equation in the nonlinear region for each group. However, the information stored in the power adjustment apparatus 200 in advance is not limited thereto. Specifically, for example, in the case where there are no variations in gain among power amplifiers, the power adjustment apparatus 200 stores therein in advance a set of a compression start point and an approximate equation in the nonlinear region. Then, when power adjustment is executed, a straight-line equation connecting one measurement point and the compression start point is derived, and coefficients of the derived straight-line equation and the stored approximate equation in the nonlinear region are stored in the RF LSI.

As described above, even when power amplifiers are not grouped based on the gain and a set of the compression start point and the approximate equation in the nonlinear region are stored in advance, input/output characteristics of a power amplifier can be determined through measurement of output power related to one measurement point. Consequently, the time needed for power adjustment can be reduced to efficiently adjust power of the power amplifier.

Similarly, for example, in the case where there are large variations in gain among power amplifiers, the gain may be grouped into four or more classes, and a compression start point and an approximate equation in the nonlinear region for each group may be stored in the power adjustment apparatus 200 in advance. Even in this case, the group of a power amplifier can be determined to determine input/output characteristics through comparison of a measurement result of output power at one measurement point with output power at the compression start point for each group.

Furthermore, in the above-mentioned embodiment, the measurement device 150 is provided separately from the power adjustment apparatus 200 as illustrated in FIG. 2. However, in the case where the power adjustment apparatus 200 has a power measuring function, the power adjustment apparatus 200 may directly measure output power of the power amplifier 130.

In addition, the operation of the power adjustment apparatus 200 described in the above-mentioned embodiment can be written as a computer program that can be executed by a computer. In this case, this computer program can be stored in a computer-readable recording medium and introduced in the computer. Examples of the computer-readable recording media include portable recording media such as a CD-ROM, a DVD disc, and a USB memory, and a semiconductor memory such as a flash memory.

According to an aspect of the power adjustment method, the power adjustment program and the power adjustment apparatus disclosed herein, power of a power amplifier can be efficiently adjusted and apparatus manufacturing cost can be reduced.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A power adjustment method comprising:
measuring first output power that is obtained when first input power to be amplified in a linear region is input to a power amplifier configured to amplify input power linearly in the linear region in which output power is less than a predetermined value and amplify the input power nonlinearly in a nonlinear region in which the output power is equal to or more than the predetermined value;
deriving, using a processor, a straight line connecting a measurement point representing the first input power and the first output power and a boundary point that is stored in advance and represents the input power and the output power at a boundary between the linear region and the nonlinear region, in a coordinate plane having an axis of the input power and an axis of the output power;
acquiring, using the processor, a coefficient of an equation that is stored in advance in correspondence with the first output power, the equation representing a relation between the input power and the output power in the nonlinear region; and
storing information on the derived straight line and the acquired coefficient of the equation in a semiconductor integrated circuit provided at a preceding stage of the power amplifier.

2. The power adjustment method according to claim 1, further comprising determining a gain of the power amplifier based on the measured first output power, wherein
the deriving includes deriving the straight line connecting the measurement point and the boundary point corresponding to the determined gain among a plurality of boundary points that are stored in advance in correspondence with a plurality of gains of the power amplifier.

3. The power adjustment method according to claim 1, further comprising determining a gain of the power amplifier based on the measured first output power, wherein
the acquiring includes acquiring information on the equation corresponding to the determined gain among a plurality of equations that are stored in advance in correspondence with a plurality of gains of the power amplifier.

4. A non-transitory computer-readable recording medium having stored therein a power adjustment program that causes a computer to execute a process comprising:
acquiring first output power that is obtained when first input power to be amplified in a linear region is input to a power amplifier configured to amplify input power linearly in the linear region in which output power is less than a predetermined value and amplify the input power nonlinearly in a nonlinear region in which the output power is equal to or more than the predetermined value;
deriving a straight line connecting a measurement point representing the first input power and the first output power and a boundary point that is stored in advance and represents the input power and the output power at a boundary between the linear region and the nonlinear region, in a coordinate plane having an axis of the input power and an axis of the output power;
acquiring a coefficient of an equation that is stored in advance in correspondence with the first output power, the equation representing a relation between the input power and the output power in the nonlinear region; and
storing information on the derived straight line and the acquired coefficient of the equation in a semiconductor integrated circuit provided at a preceding stage of the power amplifier.

5. A power adjustment apparatus comprising:
a memory that stores therein, about a power amplifier configured to amplify input power linearly in a linear region in which output power is less than a predetermined value and amplify the input power nonlinearly in a nonlinear region in which the output power is equal to or more than the predetermined value, a boundary point representing the input power and the output power at a boundary between the linear region and the nonlinear region and a coefficient of an equation representing a relation between the input power and the output power in the nonlinear region; and a processor connected to the memory, wherein the processor executes a process comprising:

acquiring first output power that is obtained when first input power to be amplified in the linear region is input to a power amplifier to be adjusted;

deriving a straight line connecting a measurement point representing the first input power and the first output power and the boundary point in a coordinate plane having an axis of the input power and an axis of the output power;

acquiring the coefficient of the equation that is stored in the memory in correspondence with the first output power; and storing information on the derived straight line and the acquired coefficient of the equation in a semiconductor integrated circuit provided at a preceding stage of the power amplifier to be adjusted.

* * * * *